United States Patent
Weilguni et al.

(10) Patent No.: US 11,076,474 B2
(45) Date of Patent: Jul. 27, 2021

(54) PROCESS FOR PRODUCING OZONE AND APPARATUS FOR OZONE GENERATION

(71) Applicant: EPCOS AG, Munich (DE)

(72) Inventors: Michael Weilguni, Hagenberg (AT); Markus Puff, Graz (AT); Pavol Kudela, Deutschlandsberg (AT)

(73) Assignee: EPCOS AG, Munich (DE)

(*) Notice: Subject to any disclaimer, the term of this patent is extended or adjusted under 35 U.S.C. 154(b) by 243 days.

(21) Appl. No.: 16/083,430

(22) PCT Filed: Feb. 23, 2017

(86) PCT No.: PCT/EP2017/054219
§ 371 (c)(1),
(2) Date: Sep. 7, 2018

(87) PCT Pub. No.: WO2017/153179
PCT Pub. Date: Sep. 14, 2017

(65) Prior Publication Data
US 2019/0098739 A1 Mar. 28, 2019

(30) Foreign Application Priority Data
Mar. 7, 2016 (DE) ........................ 10 2016 104 104

(51) Int. Cl.
*H05H 1/24* (2006.01)
*C01B 13/11* (2006.01)
(Continued)

(52) U.S. Cl.
CPC ......... *H05H 1/2475* (2013.01); *C01B 13/115* (2013.01); *H01L 41/044* (2013.01); *H01L 41/107* (2013.01); *H05H 2001/2481* (2013.01)

(58) Field of Classification Search
CPC ........... H05H 1/2475; H05H 2001/248; H05H 2001/2481; H05H 1/24; H05H 1/36;
(Continued)

(56) References Cited

U.S. PATENT DOCUMENTS 5,644,070 A * 7/1997 Gibboney ............... A61L 2/202
422/186.08
2015/0373824 A1* 12/2015 Nettesheim ........... H01L 41/053
315/111.21
(Continued)

FOREIGN PATENT DOCUMENTS

| CN | 2638482 Y | 9/2004 |
| DE | 102008063052 A1 | 1/2010 |
(Continued)

OTHER PUBLICATIONS

"Development of dielectric barrier discharge-type ozone generator constructed with piezoelectric transformers; effect of dielectric electrode materials on ozone generator", Plasma Source Sci. Technol. 18 (2009), p. 1-10 (Year: 2009).*
(Continued)

*Primary Examiner* — Xiuyu Tai
(74) *Attorney, Agent, or Firm* — Slater Matsil, LLP

(57) ABSTRACT

In an embodiment an apparatus for generating ozone includes a piezoelectric transformer having an input area and an output area, wherein the input area is configured to convert an applied AC voltage into a mechanical vibration, and wherein the output area is configured to convert the mechanical vibration into an electrical voltage so that the ozone is generated by the electrical voltage of the output area.

20 Claims, 2 Drawing Sheets

(51) Int. Cl.
*H01L 41/04* (2006.01)
*H01L 41/107* (2006.01)

(58) Field of Classification Search
CPC ............... H05H 1/44; H05H 2245/123; H05H 2240/10; C01B 13/115; C01B 13/11; C01B 2201/10; C01B 13/10; H01L 41/044; H01L 41/107; H01L 41/053; H01J 37/32449; H01J 37/32899; A61L 2/202; G01N 29/024; G01N 29/30; G01N 29/326; G01N 33/0039; G01N 2291/02881; B01J 19/08; B01J 19/088
See application file for complete search history.

(56) References Cited

U.S. PATENT DOCUMENTS

2016/0287310 A1  10/2016  Nettesheim et al.
2017/0208675 A1  7/2017  Doellgast et al.

FOREIGN PATENT DOCUMENTS

| | | |
|---|---|---|
| DE | 102013113941 A1 | 6/2015 |
| DE | 102014110405 A1 | 1/2016 |
| JP | H07165403 A | 6/1995 |
| JP | H09278411 A | 10/1997 |
| JP | 2003257589 A | 9/2003 |
| JP | 3114425 U | 10/2005 |
| JP | 2006265009 A | 10/2006 |
| JP | 2009035468 A | 2/2009 |
| WO | 2015087287 A1 | 6/2015 |
| WO | 2016012282 A1 | 1/2016 |

OTHER PUBLICATIONS

Itoh, H., et al., "Discharge plasmas generated by piezoelectric transformers and their applications," Plasma Sources Science and Technology, Institute of Physics Publishing, vol. 15, No. 2, Apr. 24, 2006, pp. S51-S61.

\* cited by examiner

PROCESS FOR PRODUCING OZONE AND APPARATUS FOR OZONE GENERATION

This patent application is a national phase filing under section 371 of PCT/EP2017/054219, filed Feb. 23, 2017, which claims the priority of German patent application 10 2016 104 104.1, filed Mar. 7, 2016, each of which is incorporated herein by reference in its entirety.

TECHNICAL FIELD

The present invention relates to a process for producing ozone and to an apparatus for generating ozone.

BACKGROUND

Ozone is a molecule $O_3$ consisting of three oxygen atoms. Ozone is gaseous under standard conditions. Ozone is a strong oxidant.

Known ozone generators are based on the principle of generating ozone by means of a high voltage, wherein the high voltage can be generated by means of electromagnetic high-voltage transformers, for example, and is guided to an electrode at which ozone is generated by means of a corona discharge.

In order to be able to avoid flashovers in the case of small dimensions of the ozone generators, it is necessary to mold the high-voltage transformers into an insulation layer, as a result of which limits are imposed on miniaturization of an apparatus having the ozone generators. Furthermore, the efficiency of the ozone generator is limited by the efficiency of the electromagnetic high-voltage transformer.

SUMMARY OF THE INVENTION

Embodiments provide an improved process for producing ozone and an improved apparatus for generating ozone.

According to an embodiment a process for producing ozone is proposed, wherein a piezoelectric transformer is used to generate the ozone. In this case, the ozone is generated by means of the following steps: —applying an input voltage to an input area of the piezoelectric transformer, with the result that a high voltage is generated in an output area of the piezoelectric transformer, and—surrounding the piezoelectric transformer with an oxygenic process gas, wherein ozone is formed from the process gas by means of the high voltage generated in the output area.

The use of a piezoelectric transformer to generate ozone provides numerous advantages. The piezoelectric transformer can have a high degree of efficiency, in particular, with the result that the ozone can be generated with a high degree of efficiency. In this case, the efficiency may be defined by the amount of ozone generated per watt hour of an input power which is applied to the piezoelectric transformer. A comparatively low input power can therefore suffice for a desired ozone generation rate if a piezoelectric transformer is used.

Furthermore, the piezoelectric transformer can enable good miniaturization of an apparatus for generating ozone. Piezoelectric transformers can be produced with very small dimensions, for example, with edge lengths of a few millimeters. For example, the piezoelectric transformer may have a length of less than 100 mm, for example, a length of 70 mm or 45 mm.

In the method step of "surrounding the piezoelectric transformer with an oxygenic process gas", the process gas can be supplied to the piezoelectric transformer by means of a fan or another apparatus, with the result that the process gas flows around the output area. Alternatively, the piezoelectric transformer can be arranged in an environment, the atmosphere of which contains the process gas. The oxygenic process gas may be air or pure oxygen, for example.

The method may also comprise the steps of measuring an amount of generated ozone using a sensor, and adapting the input voltage applied to the piezoelectric transformer on the basis of the measured amount of generated ozone in order to set a desired ozone generation rate. This makes it possible to continuously adapt the input voltage applied to the piezoelectric transformer, with the result that the amount of ozone generated by the piezoelectric transformer corresponds to the desired ozone generation rate. This makes it possible to automatically meter the generated ozone.

The piezoelectric transformer can be operated in a pulsed manner. During pulsed operation of the piezoelectric transformer, phases in which an input voltage is applied to the piezoelectric transformer and phases in which an input voltage is not applied to the piezoelectric transformer alternate at regular intervals. Accordingly, the piezoelectric transformer can be alternately switched on for a particular time and switched off for a particular time. A desired average ozone generation rate can be set by varying the duration of the phases in which the transformer is switched on and/or by varying the duration of the phases in which the transformer is switched off.

The generated ozone can be used to eliminate odors in ambient air. As a result of the oxidizing effect of the ozone, odorous substances in an atmosphere can be converted into odorless substances. Germs and odor-causing bacteria can likewise be killed, even at otherwise inaccessible locations. For this reason, ozone is suitable for eliminating unwanted odors, for example.

Another embodiment of the present invention relates to a process for producing ozone, wherein a piezoelectric transformer is used to generate the ozone, and wherein the ozone is generated by the following steps: applying an input voltage to an input area of the piezoelectric transformer, with the result that a high voltage is generated in an output area of the piezoelectric transformer, wherein the piezoelectric transformer is operated in a pulsed manner, surrounding the piezoelectric transformer with an oxygenic process gas, wherein ozone is formed from the process gas by means of the high voltage generated in the output area.

Yet another embodiment of the present invention relates to an apparatus for generating ozone, which has a piezoelectric transformer having an input area and an output area, wherein the input area is configured to convert an applied AC voltage into a mechanical vibration, wherein the output area is configured to convert a mechanical vibration into an electrical voltage, with the result that ozone can be generated by means of the generated voltage in the output area.

As already described above, the use of a piezoelectric transformer in an apparatus for generating ozone provides the advantages of a high degree of efficiency and very good miniaturization.

The apparatus for generating ozone may be a handheld device which is suitable for mobile use. The apparatus may accordingly be portable and may always be moved to the desired location of use by a user. Since the length of the longest edge of the piezoelectric transformer can be less than 100 mm and since the piezoelectric transformer also has a low energy requirement which enables operation with a battery, it is very well suited to use in a handheld device.

The apparatus may also have a housing which has at least one ozone outlet opening, wherein the piezoelectric transformer is arranged in the housing.

The ozone outlet opening is preferably arranged in the immediate vicinity of an output-side end face of the piezoelectric transformer at which the ozone is generated. Since ozone is a long-lasting molecule, an arrangement of the ozone outlet openings at a certain distance from the output-side end face of the piezoelectric transformer is also conceivable since there is no fear of the ozone decomposing immediately after it has been generated.

As a result of the arrangement and the shape of the ozone outlet opening, the generated ozone can be specifically supplied to an area of application. In this case, it is conceivable to configure the outlet opening in such a manner that the ozone emerges from the apparatus in a widely spread manner in a cloud. Alternatively, it is also possible to configure the ozone outlet opening in such a manner that a focused ozone jet emerges from the apparatus.

A sensor and a control circuit may be arranged in the housing.

The apparatus can also have a sensor which is configured to measure an amount of generated ozone. The data measured by the sensor can be transmitted to a control circuit of the piezoelectric transformer. The sensor can be configured to determine the amount of generated ozone at periodic rates.

The apparatus may also have a control circuit which is configured to apply an input voltage to the piezoelectric transformer, and a switch, wherein the control circuit and the switch are connected in such a manner that the input voltage is applied only as long as the switch is held in a pressed position.

The switch may be, in particular, a button which can be pressed by a user of the apparatus. The switch may have a pressed position and a non-pressed position.

If, as described above, an input voltage is applied only when the switch is held in the pressed position, the safety of the apparatus for generating ozone can be increased in this manner. Since ozone is a potentially harmful substance, the apparatus should be configured in such a manner that ozone is generated only when it is actually required. As a result of the fact that the switch must remain permanently pressed in order to maintain the generation of ozone, it can be ensured that the apparatus does not remain inadvertently switched on.

In an alternative configuration, the control circuit can be connected to the switch in such a manner that pressing the switch once triggers the application of the input voltage and further pressing of the switch disconnects a supply of the piezoelectric transformer with the input voltage.

The apparatus may have an integrated voltage supply. This may be a rechargeable battery or a replaceable battery. The apparatus may also have a connection for an external voltage supply. An integrated voltage supply is advantageous, in particular, when using the apparatus as a handheld device since in this case it is possible to dispense with a cable for connecting an external voltage supply.

The apparatus can be configured in such a manner that the integrated voltage supply can be charged by means of an inductive charging operation. Accordingly, it is possible to dispense with connections to which a charging device would have to be connected. The use of the inductive charging operation makes it possible to use a particularly dense housing which can ensure that the apparatus—and therefore the piezoelectric transformer—can be well protected from damage caused by external influences, for example, dirt or moisture.

A set of advantageous aspects is described below. The aspects are consecutively numbered for easier back-reference. 1. A process for producing ozone, wherein a piezoelectric transformer is used to generate the ozone, and wherein the ozone is generated by means of the following steps: —applying an input voltage to an input area of the piezoelectric transformer, with the result that a high voltage is generated in an output area of the piezoelectric transformer, —surrounding the piezoelectric transformer with an oxygenic process gas, wherein ozone is formed from the process gas by means of the high voltage generated in the output area. 2. The process according to the preceding aspect, which also has the steps of: —measuring the amount of generated ozone using a sensor, and—adapting the input voltage applied to the piezoelectric transformer on the basis of the measured amount of generated ozone in order to set a desired ozone generation rate. 3. The process according to one of the preceding aspects, wherein the piezoelectric transformer is operated in a pulsed manner. 4. The process according to one of the preceding aspects, wherein the generated ozone is used to eliminate odors in ambient air. 5. An apparatus for generating ozone, which has a piezoelectric transformer having an input area and an output area, wherein the input area is configured to convert an applied AC voltage into a mechanical vibration, wherein the output area is configured to convert a mechanical vibration into an electrical voltage, with the result that ozone can be generated by means of the generated electrical voltage in the output area. 6. The apparatus according to the preceding aspect, also having a housing which has at least one ozone outlet opening, wherein the piezoelectric transformer is arranged in the housing. 7. The apparatus according to either of aspects 5 and 6, also having a sensor which is configured to measure an amount of generated ozone. 8. The apparatus according to one of aspects 5 to 7, also having a control circuit which is configured to apply an input voltage to the piezoelectric transformer, and a switch, wherein the control circuit and the switch are connected in such a manner that the input voltage is applied only as long as the switch is held in a pressed position. 9. The apparatus according to one of aspects 5 to 7, also having a control circuit which is configured to apply an input voltage to the piezoelectric transformer, and a switch, wherein the control circuit and the switch are connected in such a manner that pressing the switch once triggers the application of the input voltage and further pressing of the switch disconnects a supply of the piezoelectric transformer with the input voltage. 10. The apparatus according to one of aspects 5 to 9, wherein the apparatus has an integrated voltage supply. 11. The apparatus according to the preceding aspect, wherein the apparatus is configured in such a manner that the integrated voltage supply can be charged by means of an inductive charging operation.

BRIEF DESCRIPTION OF THE DRAWINGS

The present invention is explained in more detail below using figures.

DETAILED DESCRIPTION OF ILLUSTRATIVE EMBODIMENTS

Figure 1:
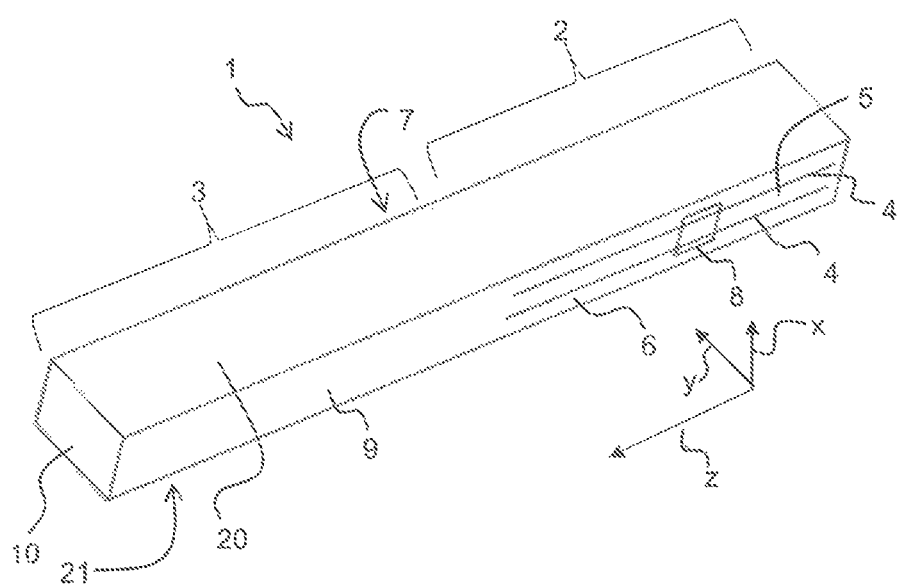
FIG. 1 shows a perspective view of a piezoelectric transformer.

FIG. 1 shows a perspective view of a piezoelectric transformer 1. The piezoelectric transformer 1 can be used, in particular, in an apparatus for generating ozone.

A piezoelectric transformer 1 is a design of a resonance transformer which is based on piezoelectricity and, in contrast to the conventional magnetic transformers, constitutes an electromechanical system. The piezoelectric transformer 1 is a transformer of the Rosen type, for example.

The piezoelectric transformer 1 has an input area 2 and an output area 3, wherein the output area 3 adjoins the input area 2 in a longitudinal direction z. In the input area 2, the piezoelectric transformer 1 has electrodes 4, to which an AC voltage can be applied. The electrodes 4 extend in the longitudinal direction z of the piezoelectric transformer 1. The electrodes 4 are alternately stacked with a piezoelectric material 5 in a stack direction x which is perpendicular to the longitudinal direction z. The piezoelectric material 5 is polarized in the stack direction x in this case.

The electrodes 4 are arranged inside the piezoelectric transformer 1 and are also referred to as inner electrodes. The piezoelectric transformer 1 has a first side surface 6 and a second side surface 7 which is opposite the first side surface 6. A first outer electrode 8 is arranged on the first side surface 6. A second outer electrode (not shown) is arranged on the second side surface 7. Electrical contact is alternately made between the inner electrodes 4 and either the first outer electrode 8 or the second outer electrode in the stack direction x.

The piezoelectric transformer 1 also has a third side surface 20 and a fourth side surface 21 which are opposite one another and are arranged perpendicular to the first side surface 6 and to the second side surface 7. The surface normals of the third and fourth side surfaces 20, 21 each point in the stack direction x.

The input area 2 can be controlled using a low AC voltage which is applied between the electrodes 4. On account of the piezoelectric effect, the AC voltage applied to the input side is first of all converted into a mechanical vibration. The frequency of the mechanical vibration is in this case substantially dependent on the geometry and the mechanical structure of the piezoelectric transformer 1.

The output area 3 has piezoelectric material 9 and is free of inner electrodes. The piezoelectric material 9 in the output area is polarized in the longitudinal direction z. The piezoelectric material 9 of the output area 3 may be the same material as the piezoelectric material 5 of the input area 2, in which case the piezoelectric materials 5 and 9 may differ in their polarization direction. In the output area 3, the piezoelectric material 9 is shaped to form a single monolithic layer which is completely polarized in the longitudinal direction z. In this case, the piezoelectric material 9 in the output area 3 has only a single polarization direction.

If an AC voltage is applied to the electrodes 4 in the input area 2, a mechanical wave is formed inside the piezoelectric material 5, 9 and generates an output voltage in the output area 3 as a result of the piezoelectric effect. The output area 3 has an output-side end face 10. In the output area 3, an electrical voltage is therefore generated between the end face 10 and the end of the electrodes 4 in the input area 2. In this case, a high voltage is generated on the output-side end face 10. In this case, a high potential difference is also produced between the output-side end face and an area surrounding the piezoelectric transformer, which potential difference suffices to generate a strong electrical field which ionizes an oxygenic process gas in such a manner that ozone is formed. In this case, atoms or molecules of the oxygenic process gas are ionized and form ozone.

The oxygenic process gas may be air or pure oxygen, in particular.

Figure 2:
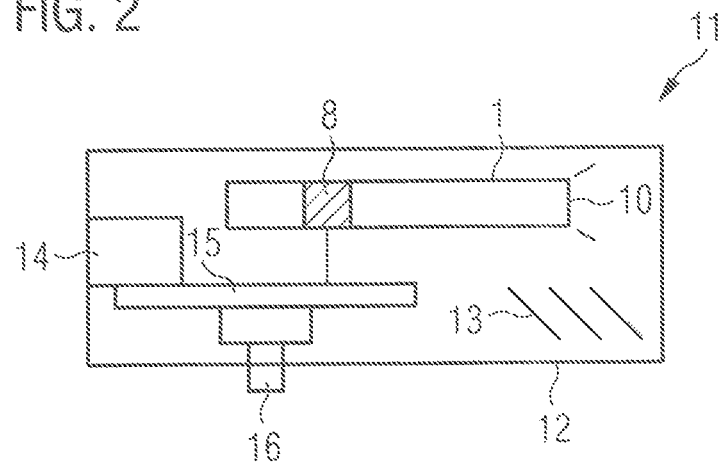
FIG. 2 shows an apparatus for generating ozone according to a first exemplary embodiment.

FIG. 2 shows a first exemplary embodiment of an apparatus 11 for generating ozone. The apparatus 11 has the piezoelectric transformer 1. The apparatus 11 also has a housing 12 in which the piezoelectric transformer 1 is arranged. The housing 12 has ozone outlet openings 13 from which the ozone generated by the piezoelectric transformer 1 can emerge from the apparatus 11. The ozone outlet openings 13 are in the form of slots. The ozone outlet openings 13 are arranged in the vicinity of the output area 3 of the piezoelectric transformer 1.

In addition to the piezoelectric transformer 1, further elements are arranged in the housing 12, in particular a printed circuit board 15, on which a control circuit can be implemented, and a connection 14 for an external voltage supply. Furthermore, a voltage supply 17 can also be integrated in the housing. These further elements are not surrounded by their own, separate housings.

The apparatus for generating ozone also has a connection 14 for an external voltage supply. A power supply unit, for example, can be connected to this connection 14.

The apparatus 11 for generating ozone also has a printed circuit board 15 on which a control circuit can be implemented. The control circuit is configured to apply an input voltage to the input area 2 of the piezoelectric transformer 1. The input voltage is an AC voltage. In this case, the piezoelectric transformer 1 can be operated in a pulsed manner. During pulsed operation, the input voltage is applied for a first predetermined period and is then not applied for a second predetermined period. These two periods alternate periodically. The ozone generation rate of the apparatus 11 can be set to a desired value by varying an input voltage applied to the piezoelectric transformer 1 and/or by varying the two periods during pulsed operation.

The apparatus 11 for generating ozone also has a switch 16 which is connected to the printed circuit board 15. In a first exemplary embodiment, an input voltage is applied to the piezoelectric transformer 1 only when the switch 16 is in a pressed position. If a user does not exert any pressure on the switch 16, the switch 16 always moves from its pressed position into a non-pressed position. Accordingly, ozone is generated by the apparatus 11 only as long as a user keeps the switch 16 in the pressed position.

In an alternative exemplary embodiment, the switch 16 can be connected to the printed circuit board 15 in such a manner that pressing the switch 16 for the first time triggers the application of the input voltage to the piezoelectric transformer 1. The control circuit will now apply an input voltage to the piezoelectric transformer 1 until a user signals, by means of further pressing of the switch 16, that the piezoelectric transformer 1 should now be switched off. Accordingly, the voltage supply for the piezoelectric transformer 1 with the input voltage is interrupted if the switch 16 is pressed a second time.

Figure 3:
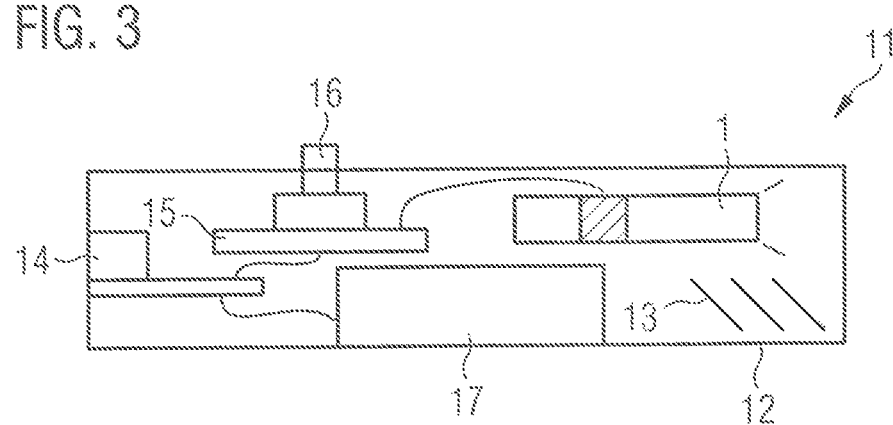
FIG. 3 shows an apparatus for generating ozone according to a second exemplary embodiment.

FIG. 3 shows a second exemplary embodiment of the apparatus 11 for generating ozone. According to the second exemplary embodiment, the apparatus 11 for generating ozone also has an integrated voltage supply 17. The integrated voltage supply 17 may be a rechargeable battery or a replaceable battery, for example. According to the exemplary embodiment shown in FIG. 3, the integrated voltage supply 17 is provided in addition to the connection 14 for the external voltage supply. Alternatively, the integrated voltage supply 17 could also be provided as a single voltage source for the apparatus 11 for generating ozone. In this case, the apparatus 11 would not have a connection 14 for an external voltage supply.

Figure 4:
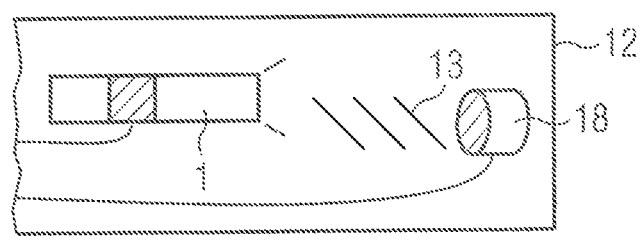
FIG. 4 shows a section of an apparatus for generating ozone.

FIG. 4 shows an enlarged section of an apparatus 11 for generating ozone according to a further exemplary embodiment. In addition to the apparatuses 11 shown in FIGS. 2 and 3, the apparatus has a sensor 18 which is configured to measure the amount of ozone currently generated by the piezoelectric transformer 1. Capturing the amount of generated ozone makes it possible to set the ozone generation to a desired ozone generation rate. In this case, the sensor 18 may be coupled to the control board with feedback. Accordingly, the control circuit can adapt the input voltage applied to the piezoelectric transformer 1 and/or the duration of the pulses during pulsed operation in a desired manner in order to set a desired ozone generation rate.

The invention claimed is:

1. An apparatus for generating ozone comprising:
   a piezoelectric transformer having an input area and an output area;
   a sensor; and
   a control circuit,
   wherein the input area is configured to convert an applied AC voltage into a mechanical vibration,
   wherein the output area is configured to convert the mechanical vibration into an electrical voltage so that the ozone is generated by the electrical voltage of the output area,
   wherein the sensor is configured to measure an amount of generated ozone, and
   wherein the control circuit is configured to adapt an input voltage applied to the piezoelectric transformer on basis of the measured amount of generated ozone in order to set a desired ozone generation rate.

2. The apparatus according to claim 1, further comprising a housing which has at least one ozone outlet opening, wherein the piezoelectric transformer is arranged in the housing.

3. The apparatus according to claim 2, wherein the sensor and the control circuit are arranged in the housing.

4. The apparatus according to claim 3,
   wherein the control circuit is configured to apply the input voltage to the piezoelectric transformer,
   wherein the apparatus has a switch, and
   wherein the control circuit and the switch are connected in such a manner that the input voltage is applied only as long as the switch is held in a pressed position.

5. The apparatus according to claim 3, wherein the control circuit is configured to apply the input voltage to the piezoelectric transformer, wherein the apparatus has a switch, and wherein the control circuit and the switch are connected in such a manner that pressing the switch once triggers an application of the input voltage and further pressing the switch disconnects a supply of the piezoelectric transformer with the input voltage.

6. The apparatus according to claim 3, further comprising a voltage supply integrated in the housing.

7. The apparatus according to claim 6, wherein the integrated voltage supply is chargeable by an inductive charging operation.

8. The apparatus according to claim 1,
   wherein the control circuit is configured to apply the input voltage to the piezoelectric transformer,
   wherein the apparatus has a switch, and
   wherein the control circuit and the switch are connected in such a manner that the input voltage is applied only as long as the switch is held in a pressed position.

9. The apparatus according to claim 1, wherein the control circuit is configured to apply the input voltage to the piezoelectric transformer, wherein the apparatus has a switch, and wherein the control circuit and the switch are connected in such a manner that pressing the switch once triggers an application of the input voltage and further pressing the switch disconnects a supply of the piezoelectric transformer with the input voltage.

10. The apparatus according to claim 2, further comprising a voltage supply integrated in the housing.

11. The apparatus according to claim 10, wherein the integrated voltage supply is chargeable by an inductive charging operation.

12. An apparatus for generating ozone comprising:
    a piezoelectric transformer having an input area and an output area,
    wherein the input area is configured to convert an applied AC voltage into a mechanical vibration, and
    wherein the output area is configured to convert the mechanical vibration into an electrical voltage so that the ozone is generated by the electrical voltage of the output area; and
    a control circuit configured to operate the piezoelectric transformer in a pulsed manner such that phases in which an input voltage is applied to the piezoelectric transformer and phases in which the input voltage is not applied to the piezoelectric transformer alternate at regular intervals.

13. The apparatus according to claim 12, further comprising a housing which has at least one ozone outlet opening, wherein the piezoelectric transformer is arranged in the housing.

14. The apparatus according to claim 13, wherein a sensor and the control circuit are arranged in the housing.

15. The apparatus according to claim 14,
    wherein the control circuit is configured to apply the input voltage to the piezoelectric transformer,
    wherein the apparatus has a switch, and
    wherein the control circuit and the switch are connected in such a manner that the input voltage is applied only as long as the switch is held in a pressed position.

16. The apparatus according to claim 14, wherein the control circuit is configured to apply the input voltage to the piezoelectric transformer, wherein the apparatus has a switch, and wherein the control circuit and the switch are connected in such a manner that pressing the switch once triggers an application of the input voltage and further pressing the switch disconnects a supply of the piezoelectric transformer with the input voltage.

17. The apparatus according to claim 14, further comprising a voltage supply integrated in the housing.

18. The apparatus according to claim 17, wherein the integrated voltage supply is chargeable by an inductive charging operation.

19. The apparatus according to claim 12, further comprising a switch,
    wherein the control circuit is configured to apply the input voltage to the piezoelectric transformer, and
    wherein the control circuit and the switch are connected in such a manner that the input voltage is applied only as long as the switch is held in a pressed position.

20. The apparatus according to claim 12, further comprising a switch, wherein the control circuit is configured to apply the input voltage to the piezoelectric transformer, and wherein the control circuit and the switch are connected in such a manner that pressing the switch once triggers an application of the input voltage and further pressing the switch disconnects a supply of the piezoelectric transformer with the input voltage.

\* \* \* \* \*